United States Patent [19]

Blackburn et al.

[11] Patent Number: 4,467,201

[45] Date of Patent: Aug. 21, 1984

[54] IMAGING DEVICES AND SYSTEMS

[75] Inventors: Anthony Blackburn, Southampton; John B. Readhead, Lyndhurst, both of England

[73] Assignee: U.S. Philips Corporation, New York, N.Y.

[21] Appl. No.: 355,837

[22] Filed: Mar. 8, 1982

[30] Foreign Application Priority Data

Mar. 30, 1981 [GB] United Kingdom ............... 8109818

[51] Int. Cl.$^3$ ........................................... H01J 31/49
[52] U.S. Cl. .................................... 250/334; 250/370; 357/30
[58] Field of Search ............... 250/330, 332, 334, 370, 250/371; 357/30

[56] References Cited

U.S. PATENT DOCUMENTS 3,989,946 11/1976 Chapman et al. .................. 250/332
3,995,159 11/1976 Elliott ................................ 250/370
4,377,747 3/1983 Smith et al. ....................... 250/370

FOREIGN PATENT DOCUMENTS 2019649 10/1979 United Kingdom .
2027556 2/1980 United Kingdom .
2027985 2/1980 United Kingdom .
2027986 2/1980 United Kingdom .

Primary Examiner—Janice A. Howell
Attorney, Agent, or Firm—Marc D. Schechter

[57] ABSTRACT

In a thermal-radiation imaging device a plurality of photoconductive detector elements are present on a common substrate. Each detector element comprises a semiconductor strip on which biasing-electrode means are spaced for causing a bias current predominantly of majority charge carriers to flow along each strip. The bias current supports an ambipolar drift of radiation-generated charge carriers in the opposite direction. Readout means for detecting these carriers comprises a connection protruding from one side of the strip. A recess extends across part of the width of the strip at the side opposite the readout connection. The readout connection of one strip extends into the recess of an adjacent strip so that a compact, closely-spaced and substantially aligned arrangement of the parallel detector elements can be obtained. Advantageous readout characteristics can also result from the narrowing of the drift path by the recess which constricts the bias current and increases the electric field in the readout area. An increase in responsivity and a shortened effective readout length can be obtained.

11 Claims, 7 Drawing Figures

IMAGING DEVICES AND SYSTEMS

BACKGROUND OF THE INVENTION

The invention relates to thermal-radiation imaging devices having a detector element comprising a strip of semiconductor material in which free charge carriers can be generated by absorption of thermal radiation and in which an ambipolar drift of radiation-generated minority charge carriers can occur along the strip. The invention further relates to thermal-radiation imaging systems comprising such a device.

British Pat. No. 1,488,258 discloses a thermal-radiation imaging device comprising a strip of semiconductor material in which free charge carriers can be generated on absorption of thermal radiation incident on said strip. Biasing-electrode means are spaced in a direction along the strip for causing a bias current predominantly of majority charge carriers to flow along the strip. The bias current is capable of supporting an ambipolar drift of radiation-generated free minority charge carriers in the opposite direction to the bias current. Readout means are present in the ambipolar drift path between the spaced biasing-electrode means.

The semiconductor material of the strip is usually cadmium mercury telluride. The readout means may comprise, in close proximity, first and second readout electrodes forming ohmic contacts to the strip. These electrodes which may be of a metal such as aluminium extend across the strip in the known device, and one of these two electrodes may be common with a biasing electrode. The voltage developed between the two readout electrodes is a measure of the density of minority carriers generated by the radiation.

However, in another form, the readout means may be either metal or a semiconductor region (preferably extending across the strip) which forms a diode junction with the strip. This junction is reversebiased by applying a suitable bias voltage. The current generated via this diode is also a measure of the density of minority carriers generated by the radiation. The diode junctions may also be used in a nonbiased condition.

In the particular forms of this device which are described and shown in British Pat. No. 1,488,258, the metal or semiconductor region providing the readout means is mounted on (and confined to) the semiconductor strip. The strip itself is mounted in a conventional encapsulation arrangement for cooling the strip to the desired operating temperature and for providing the appropriate electrical connections. It is conventional practice to use wire bonds to provide the electrical connections to a thermal-radiation imaging device in such an encapsulation. However the bonding of a wire connection directly to such a readout means on the device strip can cause problems. The area of the readout means is a sensitive area in the ambipolar drift path. Wire-bonding in this area can introduce damage into the semiconductor material, causing significant recombination of the charge carriers in this area. In extreme cases fracturing of the semiconductor material may even occur.

Furthermore, in experminents which led to the present invention, the Applicants assembled a plurality of such device strips in parallel on a common substrate to form a two-dimensional sensing area. In order to reduce the insensitive area between the parallel strips, it is desirable for the strips to be closely spaced together. In order to simplify the imaging system using such parallel strips, it is also usually desirable for the readout means and biasing electrode means to be substantially aligned in directions substantially perpendicular to the strips. This double desire for close spacing and alignment can be met by wire-bonding directly to the readout means on each strip, but this suffers from the disadvantages described above.

SUMMARY OF THE INVENTION

According to one aspect of the present invention there is provided a thermal-radiation imaging device having a detector element comprising a strip of semiconductor material in which free charge carriers can be generated on absorption of thermal radiation incident on the strip. Biasing-electrode means (also referred to as biasing means) are spaced in a direction along the strip for causing a bias current predominantly of majority charge carriers to flow along the strip. The bias current is capable of supporting an ambipolar drift of radiation-generated minority charge carriers in the opposite direction to the bias current. Readout means are provided in the ambipolar drift path between the spaced biasing-electrode means. According to the invention, a plurality of such detector elements are present on a common substrate. The detector elements comprise a plurality of substantially parallel strips of semiconductor material, each having biasing-electrode means and readout means. The read-out means of each strip comprises at least one connection which protrudes from one side of the strip at the area of the readout means. At the area of the readout means the strip has a recess which extends across a part of the width of the strip from the opposite side of the strip. The protruding connection at one side of one strip extends into the recess at the opposite side of an adjacent strip.

Such a device structure having protruding readout connections and recesses according to the invention, produces advantageous readout characteristics and compact arrangements of the strips on the substrate. Because of the spaces provided by the recesses, the protruding connections may extend alongside a part of the strip which provides a continuation of the ambipolar drift path toward one of the biasing electrode means. These connections can extend between the strips even in a closely-spaced, compact and aligned arrangement of these strips.

The protruding connections may, however, be comparatively short and may be connected in the space at the area of the recess to conductive tracks in or on the substrate. Thus, if for example wire connections are used in an encapsulation of the device, these wires can be bonded to a substrate track or to a part of the protruding connection remote from the sensitive area associated with the read-out means.

By fitting the protruding readout connections into the recesses of the adjacent strips, the arrangement of strips may be such that the biasing-electrode means and the readout means of the strips are substantially aligned in directions substantially perpendicular to the strips. Also, the strips may be so closely spaced that they are separated from each other on the substrate by slots having a width which is, for example, less than half or even a quarter of the width of one strip.

The recess which extends across a part of the width of the strip serves to narrow the strip at the area of the readout means, as compared with its width in the absence of the recess. This results in a constriction of the bias current in this area and so introduces a higher electric field which can improve the device characteristics by increasing both the drift velocity and the responsivity of the device.

It is also advantageous to effect the readout from this one side of the strip. A particularly simple and advantageous arrangement is obtained when the protruding connection forms a readout electrode contacting the ambipolar drift path adjacent to the one side of the strip. Because the narrowing is effected from the opposite side of the strip compared with the readout connection, the resulting distortion of the electric field in this area can act in such a way as to make the effective readout length slightly shorter than its actual physical length, thereby improving the spatial resolution of the device, as will be described more fully hereinafter. A particularly advantageous shaping of the strip for this purpose is obtained when the part of the ambipolar drift path leading to the area of the readout means is provided by a part of the strip having a width which decreases gradually to the width of the narrowed part which provides the continuation of the ambipolar drift path.

In order to isolate the semiconductor strips from the effect of wire connections provided in the encapsulation arrangement, it is preferable to make these connections directly to a metallization on the substrate rather than making them on part of the semiconductor body forming the strips.

The protruding readout connections may each comprise a metal stripe which extends on the substrate longitudinally alongside a part of its respective semiconductor strip and which protrudes from its respective semiconductor strip by extending locally over one side of the strip. However, an advantageous arrangement is obtained when the protruding connection is combined with a branching structure in the semiconductor strip. Thus, at the area of the readout means each of the strips may branch into two parts separated from each other by a slot, one of the parts may provide the continuation of said ambipolar drift path to one of the biasing electrode means. The protruding connection may comprise the other of the two parts and may be separated by the slot from the biasing-electrode means. In this case part of the protruding connection may be formed by an unmetallized portion of the other branching part, if so desired. A particularly compact structure is obtained when the recesses, slots and protruding connections are substantially parallel to each other.

In a particularly advantageous form, each of the device strips has an upper edge which is more rounded at least at one end of the strip than it is along the sides of the strip, and metal layers forming connections to the biasing-electrode means and to the readout means extend over this more rounded edge and onto the substrate. By so having a less rounded edge along the sides of the strips, the strips can be closely spaced in a compact geometry while the more rounded edge at the end of the strips can reduce problems in depositing a metal layer over this edge to form an unbroken and reliable connection to the readout means and biasing-electrode means.

The read-out means may be of known type, for example involving ohmic contacts or diode junctions as hereinbefore described.

Devices according to the invention may be used in a system involving mechanical scanning means such as described in British Pat. No. 1,488,258. Thus, according to a further aspect of the invention there is provided a thermal-radiation imaging system comprising a device according to the present invention, and means for scanning a thermal radiation image along the strips in the same direction as the ambipolar drift and at a rate corresponding substantially to the ambipolar drift velocity.

However, devices according to the invention may be used in thermal-radiation imaging systems using other forms of scanning, for example a system comprising means for applying a pulsed scanning voltage gradient to the strips via the biasing-electrode means so as to drive the radiation-generated carriers toward the readout means.

DESCRIPTION OF THE PREFERRED EMBODIMENTS

Figure 1:
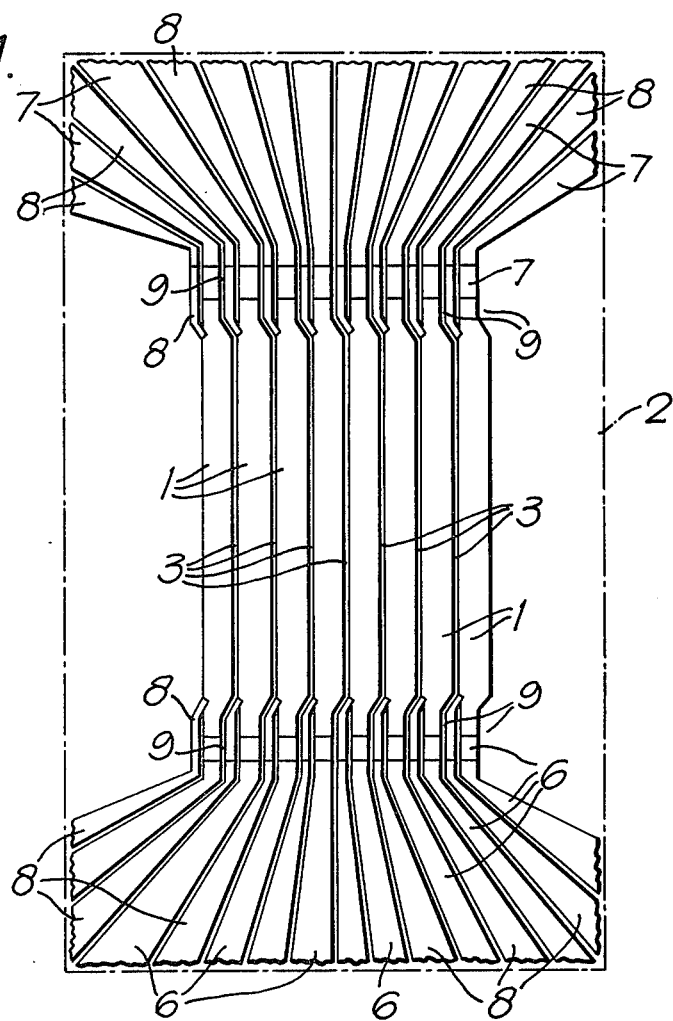
FIG. 1 is a plan view of a thermal-radiation imaging device according to the invention.

It should be noted that the drawing is not to scale, and the relative dimensions and proportions of some parts of the drawing have been exaggerated or reduced for the sake of clarity and convenience. The same reference numerals are used in the different Figures to indicate not only the same portions of the same device or element but also similar portions of different devices and elements.

The thermal-radiation imaging device of FIG. 1 comprises a plurality of photoconductive elements 1 on a substrate 2. The elements 1 are semiconductor bodies in the form of substantially parallel elongate rectangular strips of semiconductor material of a given conductivity type in which free charge carriers can be generated on absorption of thermal radiation incient on the strip.

The semiconductor material may be, for example, n-type cadmium mercury telluride $Hg_{0.79}Cd_{0.21}Te$ having a carrier concentration of less than $5 \times 10^{14} cm^{-3}$ in the absence of incident radiation. In material of this composition the radiation absorption edge at an operating temperature of 77° K is at a wavelength of approximately 11.5 micrometers. In this material the absorption of infrared radiation in the 8 to 14 micrometer window is effective in generating electron-hole pairs. The mobility of the holes at the intended temperature of operation of 77° K. is 600 $cm^2V^{-1} sec^{-1}$ and the lifetime cs 2.5 microseconds. The electron mobility is approximately $2.10^5 cm^2 V^{-1} sec^{-1}$.

Each strip 1 may have a length of, for example 1 mm., a width of 62.5 micrometers and a thickness of 10 micrometers. The strips 1 may be separated by slots 3 having a width of, for example, 12.5 micrometers. FIG. 1 shows, by way of example, eight such separated strips 1. It will be evident that different systems may require a different number of strips and different dimensions for their length, width, thickness and spacing.

The substrate 2 may be of sapphire, and the semiconductor strips 1 may be secured to the substrate by a layer of epoxy adhesive which may be, for example, 0.5 micrometer thick. For the sake of clarity this adhesive layer is not shown in FIG. 3.

On the lower and upper surfaces of each semiconductor strip 1 there are passivating layers 4 and 5, respectively, which may be of approximately 0.1 micrometer thickness and consisting mainly of oxides of mercury, cadmium and tellurium. The upper passivating layer 5 has been removed from both opposite ends of the upper surface of each strip 1 where biasing electrodes 6 and 7 are present. These electrodes may consist of deposited layers of gold of approximately 1 micrometer thickness, each in ohmic contact with the semiconductor surface.

Figure 3:
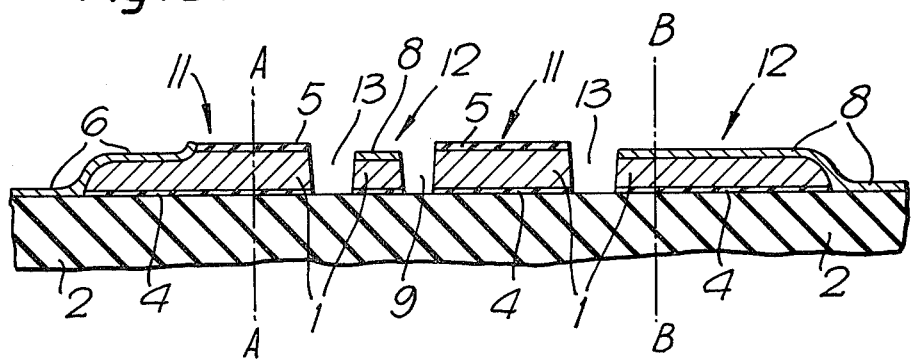
FIG. 3 is a cross-section on line III-III in FIG. 2.

As illustrated in FIG. 3, the electrodes 6 and 7 may be sunk over a short distance in the semiconductor surface, for example 1 or 2 micrometer, and they may be formed using the ion-etching and metal lift-off technique described and claimed in the published British patent application No. 2,027,946.

The metal layers forming the electrodes 6 and 7 also extend on the substrate 2 where they serve as connections to the electrodes. The electrode connections 6 and 7 on the substrate slightly expand and diverge to form areas where for example gold wire connections may be made when the device is mounted in a housing.

As illustrated in FIG. 3, the upper edge of each of the strips 1 is more rounded at the opposite ends of the strip than it is along the sides of the strip. The metal layers forming the electrode connections 6 and 7 extend onto the substrate 2 over this more rounded edge. Ion-etching may be used to form the parallel semiconductor strips 1 from a single semiconductor body, and to form the separate electrodes and their connections for each strip 1 from a metal layer deposited on the semiconductor body and on the substrate 2. The method described in the published British patent application No. 2027556 may be used.

By applying a D.C. bias voltage between these electrodes 6 and 7 spaced along each of the strips 1 a bias current predominantly of majority charge carriers (electrons, in this example) is caused to flow in a direction along the strip. This bias current is capable of supporting an ambipolar drift of radiation-generated free minority carriers (holes, in this example) in the opposite direction. The operation of the device will be described more fully below with reference to FIG. 6.

Readout means having a connection 8 are present in the ambipolar drift path between the spaced biasing electrodes 6 and 7. These readout means may be of any of the known types. They may be a surface-adjoining region of opposite conductivity type (p-type in this example) which forms a p-n diode junction with the bulk of the semiconductor strip 1. It should be noted that this region and the bulk of the semiconductor strip 1 exhibit these conductivity type properties at the intended temperature of operation of the device but do not necessarily exhibit these properties at room temperature. In the particular case when n-type cadmium mercury telluride is used for the strips 1 and where the intended operating temperature is 77° K. the presence of such a p-n diode junction may not be apparent at room temperature. Instead of a p-n junction, the readout means may comprise a Schottky (metal-semiconductor) diode junction.

Figure 2:
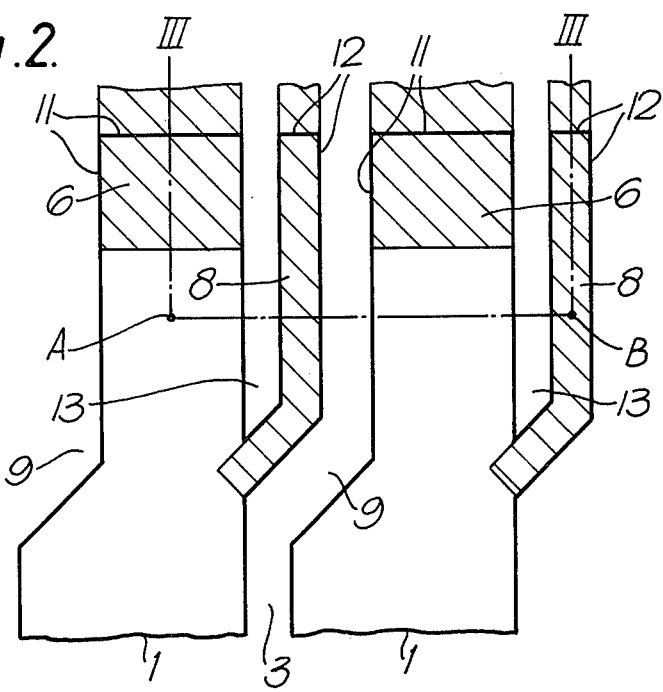
FIG. 2 is an enlarged plan view of part of a particular device of the general type of FIG. 1, showing end portions of two of its elements according to the invention.

In the example illustrated in FIGS. 1 to 3, the readout means does not include a diode junction but merely comprises spaced electrodes (electrodes 8 and 6 and electrodes 8 and 7) all of which form ohmic contacts with the semiconductor strips 1. The device of FIGS. 1 to 3 has readout means at both ends of each strip 1. This permits readout with the strips 1 biased in either direction, i.e. either readout using electrodes (8 and 6) with the bias current from electrode 6 to electrode 7 or readout using electrodes (8 and 7) with the current from electrode 7 to electrode 6. Therefore, if the characteristics of the device as made are better when biased in one direction rather than the other, this one direction can be chosen for operation.

However, it is not necessary to have readout means at both ends of the strips 1. Thus, for example, the device illustrated in FIG. 6 does not have any readout means provided adjacent the electrode 7 end of the strips 1. In the FIG. 6 arrangement, the metal layer which provides the separate electrodes 7 of each strip 1 extends over the end of each strip 1 and onto the substrate 2.

According to the present invention, the readout means (electrodes 8 and 6 and electrodes 8 and 7) of each strip 1 comprises the electrode connection 8 which prodrudes from one side of the strip 1 at the area of the readout means (a readout area). At this area each strip 1 comprises a recess 9 extending across a part of the width of the strip 1 from the side of the strip opposite the protruding connection and toward the protruding connection 8. The protruding connection 8 at one side of one strip 1 extends into this recess 9 of an adjacent strip 1. In this way the connection 8 is fitted in-between adjacent strips 1 while obtaining a very compact device geometry in which the biasing electrodes 6 and 7 and readout electrodes 8 are substantially aligned in directions substantially perpendicular to the strips 1. In the form shown in FIGS. 1 to 3, the connection 8 also extends longitudinally alongside a part 11 of the strip 1 which provides a continuation of the ambipolar drift toward one of the biasing electrodes 6 or 7.

The recess 9 serves to narrow this part 11 of the strip (at least in the vicinity of the protruding connection 8) as compared to its width in the absence of recess 9, and also (in FIGS. 1 to 3) to narrow the part 11 as compared with the part of the drift path before the area of the readout means. This gives rise to current constriction and field enhancement in the part 11 which increases both the drift velocity and the responsivity of the device elements.

Figure 4:
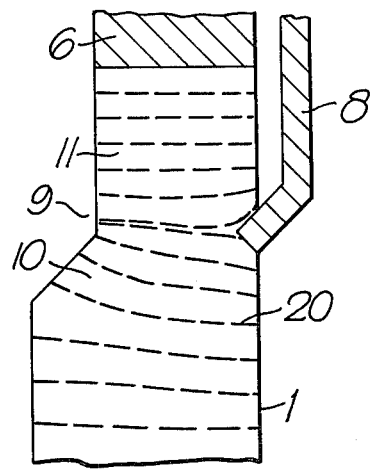
FIG. 4 is an enlarged plan view of one end portion of FIG. 2 indicating the electric field distortion.

In the advantageous form illustrated in FIGS. 2 and 4, the part of the ambipolar drift path leading to the area of the readout means 6 and 8 is provided by a part 10 of the strip 1 having a width which decreases gradually to the width of the narrower part 11. Equipotentials which occur in the electric field distribution in this structure are indicated by broken lines 20 in FIG. 4. Because the narrowing recess 9 is on the opposite side of the strip 1 from that contacted by the protruding readout connection 8, the field lines 20 along the side adjacent the recess 9 bend into the part 11 from the part 10. This distortion of the equipotentials in the area between the parts 10 and 11 effectively shortens the length of the part 11 over which the average minority carrier density is measured for the output signal. By thus effectively reducing the area over which the minority carrier density is sampled, the spatial resolution of the device can be improved. The closer spacing of the equipotentials 20 within the part 11 in FIG. 4 also indicates the higher electric field in this area compared with the main part of the strip 1, and this also improves the spatial resolution by reducing the minority carrier transit time through the part 11.

However, the part 11 should not be too narrow, because its sides have a higher carrier recombination effect which will reduce the minority carrier lifetime in the part 11. Thus the continuation part 11 may be at least half the width of the main part of the ambipolar drift path before this area. In the particular example of FIGS. 1 to 4 the part 11 may be, for example 35 micrometers wide.

If the adjacent biasing electrode 6 or 7 is too close to the readout electrode 8 it can reduce the responsivity and detectivity of the element. Therefore, the continuation of the drift path in the part 11 is preferably longer than its width. In the arrangement illustrated in FIGS. 1 to 4, the distance between the biasing electrode 6 and the area where the readout electrode 8 contacts the drift path may be, for example 50 micrometers.

The electrode connection 8 may be a metal stripe which extends directly on the substrate 2 alongside the end portion of the strip 1 and which extends locally over one side of its respective strip 1 to form the readout electrode contacting the drift path in the strip 1. Thus, in FIG. 4 the right-hand side of the strip 1 may continue in a straight line below the protruding part of the electrode connection 8. Such a straight continous edge is illustrated only by way of example in FIG. 4. However a branching part of the strip 1 may continue below the protruding connection 8 in FIG. 4 to carry the connection 8. Such an arrangement is illustrated in FIGS. 2 and 3. At the area of the readout means (electrodes 8 and 6 and electrodes 8 and 7) each of the strips 1 branches into two parts 11 and 12 (see FIGS. 2 and 3) separated from each other by a slot 13 which extends from that area in a direction substantially parallel to the strip 1.

The electrode 8 extends from the readout area in a direction substantially parallel to the slot 13 to form the metal stripe connection of the readout electrode 8 which is supported by the branching part 12. This connection comprises the part 12 at least as a mechanical support for the metal stripe. This electrode connection is separated by the slot 13 from the adjacent biasing electrode 6 or 7. As shown in FIG. 3, this stripe connection 8 is sunk over a short distance in the semiconductor surface and also extends over the more rounded end edges of the strips 1 and onto the substrate 2 to form areas for wire connections. This metal stripe pattern may be formed simultaneously from the same metal layer as the electrodes 6 and 7, and the slots 13 may be formed simultaneously with the slots 3 and recesses 9. The slots 13 may also each have a width of, for example, 12.5 micrometers. Generally, the part 11 which provides the continuation of the ambipolar drift path will be wider than the part 12 which does not need to be so wide for its connection purposes. The part 12 may be, for example 15 micrometers wide.

Figure 5:
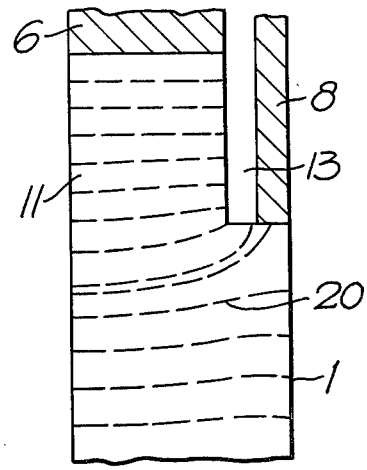
FIG. 5 is a similar plan view indicating the electric field distortion in a particular device which is not constructed according to the present invention.

FIG. 5 illustrates one particular form of a branching strip structure which is not constructed according to the present invention. The electric field distortion in the FIG. 5 structure is indicated by the equipotentials 20. Because the narrowing of the part 11 providing the coninuation of the drift path in the readout area is effected only by the slot 13 at the same side of the strip 1 as the readout electrode 8, the field lines 20 along the opposite side of the strip 1 are curved in the opposite direction to those of the FIG. 4 structure. Thus, a disadvantage of the FIG. 5 structure is that this field distortion slightly lengthens the effective sampling length of part 11 so that the spatial resolution of the FIG. 5 device is slightly worse than that of the FIG. 4 device.

In the particular form illustrated in FIGS. 2 and 4, the readout electrode 8 contacts the drift path at one side and so does not extend beyond the inner end of the slot 13. This results in the advantageous field distribution illustrated in FIG. 4. However, other forms are possible in which the readout electrode 8 has a more extensive contact area with the drift path. Thus, for example, although it is advantageous to effect the readout from the one side of the strip 1, the metal strip 8 may also extend right across the width of the strip 1, so as to form the readout electrode over the whole width of the ambipolar drift path.

During operation the device is maintained at a cryogenic temperature, and so it is further mounted according to the specific intended application. Such further mounting is not illustrated in the accompanying drawings, but will normally consist of mounting the substrate 2 in an evacuated enclosure having a window for transmission of infrared radiation (for example in the 8 to 14 micrometer band). The enclosure is provided with means for maintaining the substrate 2 with its semiconductor strips 1 at the required operating temperature (for example 77° K.) One such form of mounting consists of the Dewar-type encapsulation, as commonly employed in the infrared detector art.

Figure 6:
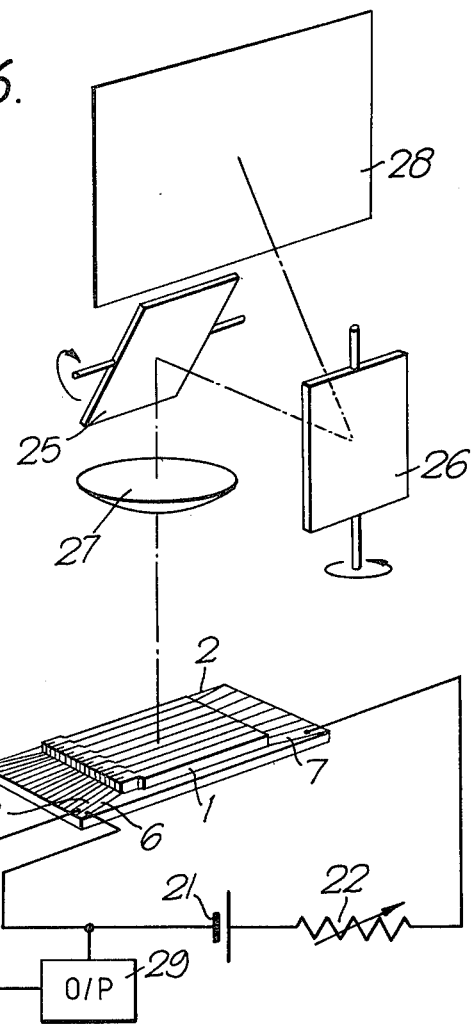
FIG. 6 is a perspective view, partly schematic, of parts of a thermal-radiation imaging system according to the invention.

The operation of a device according to the invention will now be described with reference to FIG. 6. Via its biasing electrodes 6 and 7 and wire connections, each strip 1 is connected in series with a D.C. bias source 21 and a variable resistor 22 to produce a constant bias current predominantly of majority charge carries (in this case, electrons) flowing in the strips 1 in the longitudinal direction from the electrode 6 to the electrode 7. For the sake of clarity of drawing, the connections of a bias source 21 to all the electrodes 6 and 7 are not shown in FIG. 6 which only illustrates the connections of one of the strips 1.

The bias current is capable of supporting an ambipolar drift of radiation-generated free minority carries (in this case, holes) in the opposite direction, i.e. in the direction from electrode 7 to electrode 6. A suitable range of bias voltage between the electrodes 6 and 7 is from 1 volt to 10 volts. At a potential drop of 15 volts per cm. in the n-type material of the composition described above, the ambipolar mobility is approximately 400 $cm^2 V^{-1} sec^{-1}$.

The scanning of a radiation pattern and the focussing of an image of an elemental area of the pattern on the strips 1 may be effected in a similar manner to that described in British Pat. No. 1,488,258. Such means for scanning a thermal radiation image along the strips 1 in the same direction as the ambipolar drift and at a rate corresponding substantially to the ambipolar drift velocity are illustrated in a simplified diagrammatic manner in FIG. 6. They may comprise a pair of rotatable mirrors 25 and 26 and a lens system 27. By these means, image areas of a radiation pattern from a scene 28 are moved with a velocity in the range of 5,000 cm. $sec^{-1}$ to 20,000 cm. $sec^{-1}$ along the surface of one or more of the semiconductor strips 1.

Thus, as the image is scanned across the surface of the semiconductor strips 1 at a rate corresponding to the ambipolar drift velocity, integration of the radiation-generated minority carriers occurs in the part of the n-type strips 2 where the radiation is incident before they reach the readout electrodes 8. The length of the ambipolar drift path in front of the relevant readout means and over which total integration of the radiation-generated minority carriers can be effected is limited to a distance determined by the lifetime of minority carriers in the semiconductor material, the electric field, and the ambipolar mobility which pertains to the semiconductor material and which usually approximates the minority carrier mobility. This distance therefore has to be taken into account in the positioning of the readout means.

Due to the passage of these integrated radiation-generated minority carriers through the strip part 11 between the readout electrodes 8 and 6, conductivity modulation occurs in this part 11. The picture signal is derived in known manner using an output circuit 29 which is connected between the electrodes 8 and 6 and which amplifies and processes the voltage change occurring between the electrodes 8 and 6 as a result of the conductivity modulation. For the sake of clarity in the drawing, only the output circuit 29 for one strip 1 has been shown, whereas in practice separate output circuits 29 are provided for each strip 1 and are connected between the electrodes 6 and 8 of their respective strip.

It will be evident that many modifications are possible within the scope of the present invention. Thus, for example the composition of the n-type cadmium mercury telluride may be chosen differently, for example to provide a device for imaging radiation in the 3 to 5 micrometer band. Semiconductor materials other than cadmium mercury telluride may be used to form the photoconductive strips 1.

In the FIG. 2 arrangement, the metal stripe 8 extends over the whole upper surface of the part 12 to at least substantially the inner end of the slot 13. The metal stripe 8 therefore provides the main conductive path of the readout connection comprising the part 12. In such a case it is not necessary that the part 12 forms a conductive part of the electrical connection so that it may be merely a mechanically supporting part of the connection. However, if the system in which the device is to be used can have a higher series resistance in the readout connection, the metal stripe 8 need not extend as far as the inner end of the slot 13; it may extend on the part 12 only so far as, for example, the electrode 6 or 7 extends on the part 11 so that the part of the readout connection between this shorter stripe 8 and the ambipolar drift path is provided solely by the conductive path in the semiconductor part 11.

In the embodiments described, the strips 1 are formed as discrete semiconductor bodies on an insulating substrate, for example of sapphire. However other arrangements are also possible according to the invention, in which the strips 1 are portions of a common semiconductor body and may be integrally united via, for example, a common portion which may support a common biasing electrode (either 6 or 7).

None of the electrodes 6, 7 and 8 need extend onto the substrate 2, which may be of sapphire as in the previous embodiments. However in a further modified form according to the invention, the strips 1 may be formed from an epitaxial layer of one conductivity type material which is deposited on, for example, an intrinsic substrate 2 or a substrate 2 of cadmium telluride. In this form, the epitaxial material is removed at grooves 3 and 13 to provide the element structure, and the biasing and readout electrode metallizations 6, 7 and 8 are confined to the remaining epitaxial layer portions. The grooves 3 and 13 merge together to isolate the adjacent electrodes 6, 7 and 8, and wire connections are bonded to parts of the electrode pattern 6, 7 and 8 on the epitaxial layer remote from the active strip portions 1.

Figure 7:
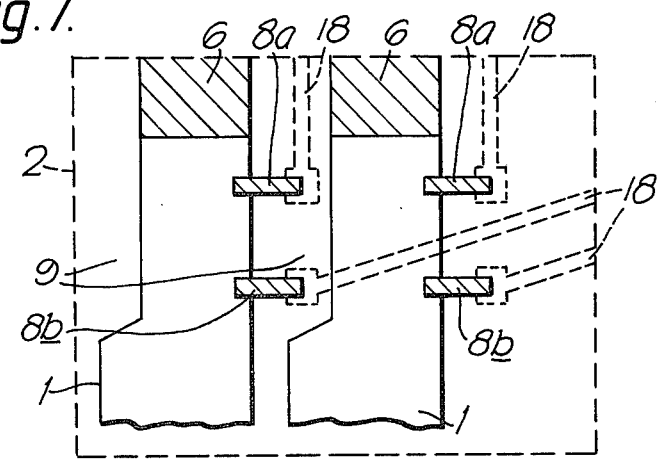
FIG. 7 is a plan view of an end portion of a further thermal radiation imaging device according to the invention.

In each of the embodiments of FIGS. 1, 2, 3, 4, and 6, the readout means uses one of the biasing electrodes 6 or 7 as one of the readout electrodes at an end of a strip. However such an arrangement is not necessary according to the invention. Thus another form of readout area geometry is illustrated in FIG. 7, in which at one end of each strip 1 the readout means comprises a pair of electrodes formed by short metal stripes 8a and 8b. The second electrode 8a of the pair is separate from the biasing electrode 6, and both metal stripes 8a and 8b extend over one side of the strip 1. These stripes 8a and 8b of one strip 1 extend into the recess 9 of an adjacent strip 1 and are connected in this enlarged space (which includes the recess 9) to conductive tracks 18 in or on the substrate 2. The tracks 18, which are illustrated in broken outline in FIG. 7, may be, for example, doped regions in a semiconductor substrate 2 or metal tracks on an insulating substrate 2. At least where the tracks 18 pass below the device strips 1, they are insulated from the strips 1 by an intermediate insulating layer. Although only the end parts of only two semiconductor strips 1 are shown in FIG. 7 there will generally be at least three or more such semiconductor strips 1 side-by-side on the substrate 2.

In order to remove any unwanted injected minority carriers (holes) from the ambipolar drift path adjacent to the main biasing electrode which forms the anode (electrode 7 in FIG. 6) there may be provided a rectifying junction with an electrode connection adjacent this biasing electrode 7 in order to provide a drain for such minority carriers and thereby effectively isolate the first stage of the ambipolar drift path from this biasing electrode. This electrode connection for such a rectifying junction may protrude into a recess in a manner similar to that for the readout means at the opposite end of each strip.

It is not necessary for the strips 1 to extend in substantially straight lines. Thus, each of the strips 1 may meander about an imaginary straight line, which lines of the different strips are substantially parallel to each other. Individual meandering strips are illustrated in the published of British patent application No. 2,019,649.

We claim:
1. A thermal-radiation imaging device comprising:
   a substrate;
   a plurality of strips of semiconductor material in which free charge carriers can be generated on absorption of thermal radiation incident on the strips, said strips having lengths and widths and being arranged substantially parallel to each other on the substrate;
   biasing electrode means for causing a bias current predominately of majority carriers to flow along the lengths of said strips, said bias current being capable of supporting an ambipolar drift of radiation-generated minority carriers in the opposite direction to the bias current; and
   a plurality of readout means, each readout means reading out a signal representative of the ambipolar drift in one corresponding semiconductor strip, each readout means being arranged in the ambipolar drift path;

characterized in that;

each readout means comprises an electrically conductive connection element which protrudes from a first side of its corresponding strip at a readout area;

each semiconductor strip has a recess therein at the readout area, said recess extending across part of the width of the strip beginning from the side opposite to the side from which the connection element protrudes; and the semiconductor strips are arranged on the substrate adjacent each other such that the connection elements protruding from the first sides of each strip extend into the recesses of adjacent strips.

2. A thermal-imaging device as claimed in claim 1, characterized in that the semiconductor strip has a portion near the readout area whose width decreases gradually toward the readout area.

3. A thermal-imaging device as claimed in claim 2, characterized in that:

the biasing electrode means comprises pairs of electrodes spaced along the length of each strip and substantially aligned in a direction substantially perpendicular to the strips; and the readout means are substantially aligned in a direction substantially perpendicular to the strips.

4. A thermal-imaging device as claimed in claim 3, characterized in that the connection element is a readout electrode, and it extends along the first side of its corresponding strip.

5. A thermal-imaging device as claimed in claim 4, characterized in that the readout electrode protrudes from the strip in the direction of the ambipolar drift.

6. A thermal-imaging device as claimed in claim 5, characterized in that at the readout area each strip divides into two branches separated from each other by a slot, a first branch providing a path for the ambipolar drift, a second branch protruding from the strip and forming at least part of the readout means.

7. A thermal-imaging device as claimed in claim 6, characterized in that the slots and recesses extend substantially parallel to each other.

8. A thermal-imaging device as claimed in claim 7, characterized in that:

each strip has an upper edge at one end of the strip which is more rounded than an upper edge at the sides of the strip; and the readout means and the biasing means comprise metal layers provided on these rounded edges and on the substrate.

9. A thermal-imaging device as claimed in claim 8, characterized in that the first branch of the semiconductor strip is wider than the second branch.

10. A thermal-imaging device as claimed in claim 9, characterized in that the second branch of the semiconductor strip is provided with a metal stripe which extends at least partially onto the first branch.

11. A thermal-radiation imaging system comprising:

a thermal-radiation imaging device as claimed in claim 10; and means for scanning a thermal-radiation image across the strips in the same direction as the ambipolar drift and at a rate corresponding substantially to the ambipolar drift velocity.

* * * * *